Figure 1:
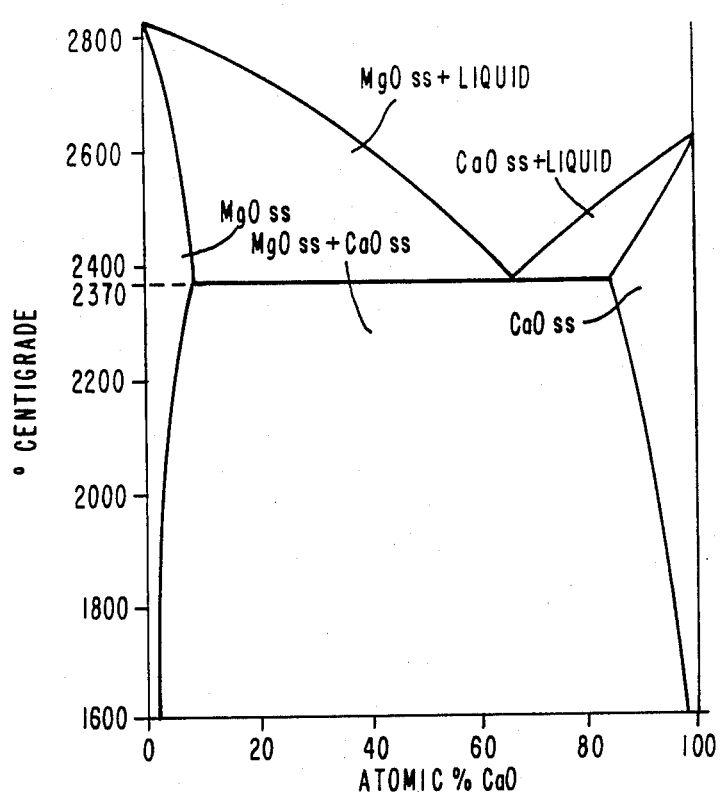

United States Patent [19]

Talvacchio et al.

[11] Patent Number: 4,768,069
[45] Date of Patent: Aug. 30, 1988

[54] SUPERCONDUCTING JOSEPHSON JUNCTIONS

[75] Inventors: John J. Talvacchio, Churchill Boro; Alexander I. Braginski, Pittsburgh; Michael A. Janocko, Edgewood Boro; John R. Gavaler, Penn Hills Township, Allegheny County, all of Pa.

[73] Assignee: Westinghouse Electric Corp., Pittsburgh, Pa.

[21] Appl. No.: 30,003

[22] Filed: Mar. 23, 1987

[51] Int. Cl.$^4$ .............................................. H01L 39/22
[52] U.S. Cl. .......................................... 357/5; 357/4
[58] Field of Search .................................... 357/5, 4, 6

[56] References Cited

U.S. PATENT DOCUMENTS

| | | |
|---|---|---|
| 3,816,845 | 9/1971 | Cuomo et al. . |
| 3,999,203 | 12/1976 | Lihari ........................ 357/5 |
| 4,242,419 | 12/1977 | Dayem et al. . |
| 4,316,785 | 2/1982 | Suzuki ..................... 357/5 X |
| 4,423,430 | 12/1983 | Masuo ...................... 357/5 |
| 4,432,134 | 5/1982 | Jones et al. . |
| 4,499,119 | 2/1985 | Smith ....................... 357/5 X |

OTHER PUBLICATIONS

R. C. Doman et al, in *The Journal of the American Ceramics Society*, Jul. 1963, pp. 313 to 316, titled "Phase Equilibria in the System CaO-MgO".
Julia M. Philips in a book titled *Layered Structures, Epitaxy in Innerfaces*, by J. M. Gibson et al., (1985), p. 143 et seq., titled "Recent Progress in Epitaxial Fluoride Growth on Semiconductors".
J. W. Mathews et al., Titled "Effect of Coherency Strain and Misfit Dislocations on the Mode of Growth of Thin Films," *Thin Solid Films*, 26, p. 129 to 134 (1975).
"Abnormal Metastable Crystalline Structures" by K. Chopra, in Thin Film Phenomena (McGraw-Hill, New York, 1969), pp. 199 to 214.

*Primary Examiner*—Martin H. Edlow
*Attorney, Agent, or Firm*—A. Mich, Jr.

[57] ABSTRACT

Disclosed is a superconducting Josephson junction which comprises a layer of niobium nitride on a substrate, an epitaxial layer of a pseudo-binary compound on the layer of niobium nitride, where the pseudo-binary compound has the composition about 3 atomic percent MgO—about 97 atomic percent CaO, to about 97 atomic percent MgO—about 3 atomic percent CaO, and an epitaxial layer of niobium nitride on the layer of pseudo-binary compound. Also disclosed is a method of making a Josephson junction by depositing a layer of niobium nitride onto a suitable substrate, depositing an expitaxial layer of a pseudo-binary compound onto the layer of niobium nitride, where the pseudo-binary compound has a composition of about 3 atomic percent MgO—about 97 atomic percent CaO, to about 97 atomic percent MgO—about 3 atomic percent CaO, and depositing an epitaxial layer of niobium nitride onto the layer said pseudo-binary compound.

13 Claims, 2 Drawing Sheets

SUPERCONDUCTING JOSEPHSON JUNCTIONS

BACKGROUND OF THE INVENTION

To increase the speed with which an integrated circuit can process information, it is necessary to reduce the distance that the electrical signals have to travel. While this can be accomplished by reducing the size of the circuit components, it can also be accomplished by reducing the electrical resistance in the circuit, which reduces power dissipation and permits closer packing of electrical components. In a superconducting circuit, the electrical resistance is reduced to zero by cooling the circuit below the temperature at which its components become superconducting. While commercial superconducting electronics with medium or large scale integration have not yet been built, some research has been done on designing the components.

The state of the art design for a Josephson tunnel junction for superconducting electronics is a trilayer, on a substrate, formed of a layer of superconducting niobium nitride (NbN), an insulating layer of magnesium oxide (MgO), and a second layer of niobium nitride on top. While this structure is operable, it is not optimal because the lattice spacing of magnesium oxide does not match the lattice spacing of niobium nitride, although they do not have the same structure and crystal orientation. Niobium nitride has a B1 (sodium chloride) structure with a lattice constant, ($a_o$) of 4.38 angstroms; magnesium oxide and calcium oxide have the same B1 structure, but magnesium oxide has a lattice constant of 4.21 angstroms. Because of this mismatch, the initial layer of the top niobium nitride will be partly disordered, the superconducting energy gap reduced, and the operating temperature of the junction reduced.

SUMMARY OF THE INVENTION

We have discovered that a superconducting Josephson junction can be formed from a pseudo-binary solid solution of magnesium and calcium oxides sandwiched between two niobium nitride layers. Calcium oxide has the same B1 structure as MgO but a lattice constant of 4.84 angstroms. By selecting the proportion of magnesium oxide to calcium oxide in the pseudo-binary layer, we are able to match the lattice spacing of the niobium nitride so that both the pseudo-binary layer and the top layer of niobium nitride are epitaxial with the bottom layer of niobium nitride.

The discovery that a pseudo-binary layer of magnesium oxide-calcium oxide can be formed at room temperature is quite remarkable because the equilibrium phase diagram for the MgO-CaO system indicates that at room temperature solid solutions containing between about 2% MgO-98% CaO and about 98% MgO-2% CaO do not exist. That is, below 1600° C. a mixture of $Mg_{1-x}Ca_xO$ where $0.02 \S \times \S 0.98$ will crystallize as separate domains of practically pure MgO and practically pure CaO, rather than as a solid solution of $Mg_{1-x}Ca_xO$.

Because MgO-CaO solid solutions have the same structure and orientation as NbN, and we are now able to grow epitaxial layers that have the same lattice spacing, the Josephson junctions of this invention have a more uniform oxide layer than do the Josephson junctions formed with MgO. (Theoretical and experimental background for such a claim is found in J. W. Mathews et al., "Effect of Coherency Strain and Misfit Dislocations on the Mode of Growth of Thin Films," Thin Solid Films 26 pp. 129-134 (1975).)

Also, the superior oxide layer of this invention results in a better quality niobium nitride top layer on the oxide layer. Until now, it was very difficult to get a good quality niobium nitride top layer, especially the bottom of the niobium nitride top layer. However, because the oxide layer of this invention has the same lattice spacing as the niobium nitride layer, we are able to obtain a very good quality niobium nitride top layer. As a result, the superconducting transition temperature of the niobium nitride layer is higher.

DESCRIPTION OF THE INVENTION

Figure 3:
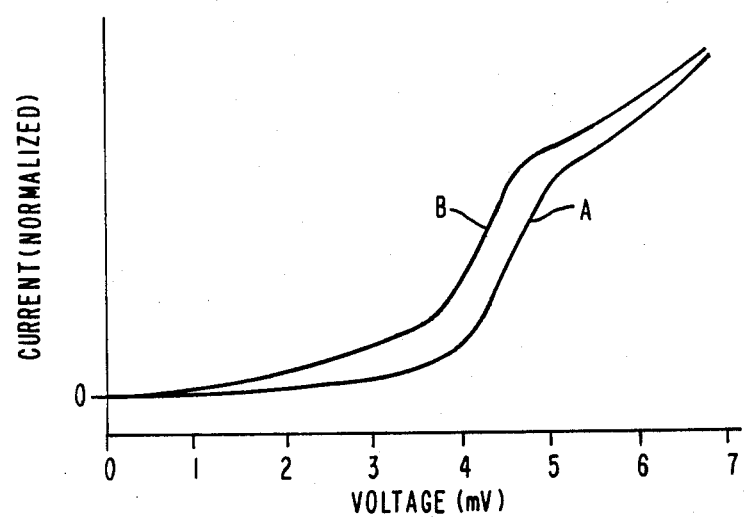

FIG. 1 is an equilibrium phase diagram for the MgO-CaO system;

FIGS. 2A to 2D are side views in section illustrating one method of constructing an Josephson junction according to this invention; and FIG. 3 is a graph of current versus voltage showing comparing the results of a test performed on a Josephson junction according to this invention, as described in the Example which follows, with the results on a Josephson junction using a magnesium oxide insulating layer.

The equilibrium phase diagram shown in FIG. 1 was taken from an article by R. C. Doman et al. in the *Journal of the American Ceramics Society*, July, 1983, titled "Phase Equilibria in the System CaO-MgO," which is herein incorporated by reference. The ordinate gives the temperature in degrees centigrade and the abscissa gives the atomic percent of calcium oxide in the MgO-CaO system. The phase diagram shows that below a temperature of 2370° C., separate solid solutions (SS) of magnesium oxide and calcium oxide form, and that below 1600° C. no mixed solid solutions of magnesium oxide and calcium oxide exist where the amount of calcium oxide is greater than 2% of less than 98%.

Figure 2A:
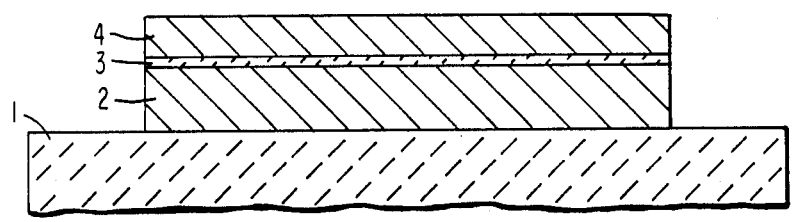
Figure 2B:
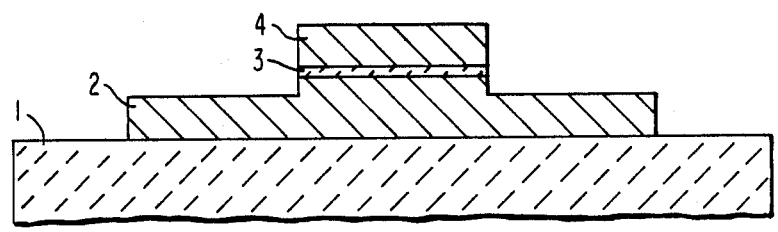
Figure 2C:
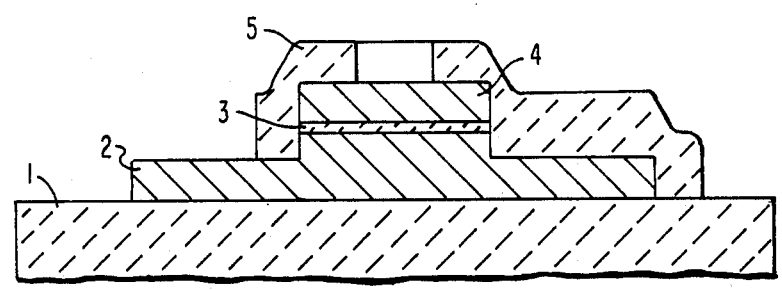
Figure 2D:
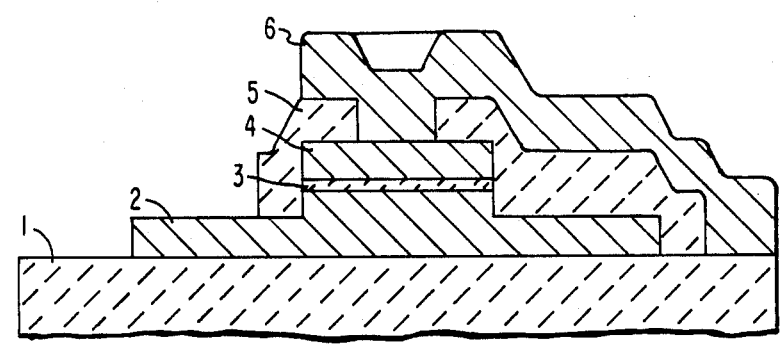

In FIG. 2A a substrate 1 has deposited thereon a base electrode 2 of niobium nitride, a barrier layer 3 of the pseudo-binary compound, and a counterelectrode 4 also of niobium nitride. In FIG. 2B portions of the counterelectrode barrier layer and base electrode have been etched away. In FIG. 2C an insulating layer, preferably of silicon dioxide, has been applied over portions of the stucture. In FIG. 2D a contact layer 6, also of niobium nitride, has been deposited.

Any substrate material that can provide mechanical support for the junction and that helps to promote growth of niobium nitride can be used in this invention. The preferred materials are sapphire ($\alpha$-$Al_2O_3$) or magnesium oxide (MgO) as these materials closely match the lattice spacing of niobium nitride. The substrate may be of any size and thickness but is typically about 6 millimeters square to about 2 inches diameter and about 20 mils thick. The substrate may have any orientation, but we have found that the (100) orientation of a magnesium oxide substrate produces smooth single-crystal layers. Also, we have found that the (111) niobium nitride single-crystal films grown on a sapphire substrate had the best junction properties. The (111) niobium nitride orientation can be obtained if the sapphire orientation is (11$\bar{2}$0) or (0001). Sapphire is preferred to magnesium oxide as a substrate because it is more available and easier to use.

In constructing the superconducting Josephson junction according to this invention, the first step is to deposit a layer of niobium nitride on the substrate. This can be accomplished, for example, by chemical vapor deposition or sputtering, processes that are well known in the art. In chemical vapor deposition, a niobium-containing gas is passed over a hot surface causing a reaction to occur that forms niobium nitride, which deposits upon the substrate. Either radio frequency (RF) sputtering or direct current (DC) sputtering can also be used, but reactive DC sputtering is preferred as it produces a higher superconducting transition temperature. Reactive DC sputtering is performed by sputtering niobium in a gas containing nitrogen and argon (and no oxygen), where the niobium reacts with the nitrogen to form niobium nitride at the substrate. (The conditions for depositing a single crystal niobium nitride superconductor by DC magnetron sputtering are reported in the literature. See, for example, V. L. Noskov et al., Soviet Physics Crystallography, 25(4), 504 (1980).) The niobium nitride layers may be either polycrystalline or single crystal, but single crystal layers are preferred as they are easier to test. The niobium nitride layer may be about 400 angstroms to about 5000 angstroms thick, and is preferably about 1500 to about 2500 angstroms thick. If the niobium nitride layer is too thick, it becomes difficult to cover the steps that are formed when the layers are etched; and if the niobium nitride layer is too thin, the speed of the circuit decreases. The thickness of the layer is determined by the deposition time.

In the next step of the process of this invention, a layer of the pseudo-binary compound is deposited upon the layer of niobium nitride; the pseudo-binary compound grows on the layer of niobium nitride by single crystal epitaxy and has the same structure as the layer of niobium nitride. The composition of the pseudo-binary compound can vary from about 3 atomic percent MgO and about 97 atomic percent CaO to about 97 atomic percent MgO and about 3 atomic percent CaO. A preferred range is about 22 to about 35 atomic percent CaO (and the remainder, MgO) because we have determined by calculation that the optimal composition is 0.73 atomic percent MgO-0.27 atomic percent CaO, and this range gives a lattice spacing mismatch of 1% or less. The layer of pseudo-binary compound can be deposited, for example, by RF sputtering or by evaporation. Evaporation is accomplished by heating an appropriate mixture of MgO-CaO above the melting point of MgO (2800° C.). It should be noted that the composition of the layer of pseudo-binary compound may not be exactly the same as the composition of the material which was used to form the layer due to differences in vapor pressure between the magnesium oxide and calcium oxide as they are being evaporated. However, once the differences in composition have been determined for the particular apparatus and deposition parameters being used, the composition of the starting material can be adjusted to obtain the desired composition of the deposited layer. The thickness of the insulating layer of pseudo-binary compound is preferably about 5 to about 25 angstroms as thinner layers may result in superconducting shorts, and thicker layers have greater resistance which reduces the circuit speed.

In the next step of the process of this invention, the second niobium nitride layer is deposited upon the layer of pseudo-binary compound. The deposition process and parameters for that layer can be the same as for the first layer of niobium nitride.

Once the trilayer on the substrate has been deposited, various processes can be used, as is well known in the art, to form circuit patterns and attach connections. These processes include etching, the application of photoresists, the development of photoresist to form circuit patterns, and the deposition of contact layers. The Josephson junctions of this invention, in addition to being used in superconducting computers, can also be used in other types of apparatus such as radar signal processing apparatus.

The following examples further illustrate this invention:

EXAMPLE 1

A polished single-crystal sapphire plate ¼ inch by ¼ inch by 20 mils thick having a (11$\bar{2}$0) orientation was placed in a DC magnetron and was heated to 700° C. Using a gas mixture of 4 mtorr argon, 0.8 mtorr nitrogen, and 0.05 mtorr methane, niobium nitride was sputtered onto the substrate a rate of 40 angstroms per minute. The resulting film was about 1,000 angstroms thick and had a (111) cyrstal orientation.

Maintaining the temperature at 700° C., a barrier layer was deposited on the niobium nitride layer from a mixture of 73 mole percent magnesium oxide—27 mole percent calcium oxide using RF magnetron sputtering in pure argon at 7 mtorr. The deposition rate was 6 angstroms a minute and the barrier film was about 20 angstroms thick.

The temperature of the coated substrate was cooled to 150° C. and the counter electrode was deposited in the same manner as the base electrode at the same deposition rate. The counter electrode was about 500 angstroms thick and had a (111) crystal orientation.

Using conventional photolithography, a photoresist was spun onto a substrate and was exposed and developed to define a junction area. The exposed area was etched using reactive ion etching down to the base electrode as shown in FIG. 2B. A second layer of photoresist was applied, leaving an opening for contact to the top electrode. This photoresist was left in place as an insulator as shown in FIG. 2C. Finally, a contact layer of niobium nitride was applied as shown in FIG. 2D in the same manner as the other layers of niobium nitride.

The completed Josephson junction was tested in a magnetically shielded dewar filled with liquid helium at 4.2K by passing a slowly increasing current through it while measuring the voltage. When the voltage had increased to about 7 millivolts, the experiment was terminated.

FIG. 3 is a graph which gives the results of this experiment. The graph proves that conduction through the Josephson junction was by tunnelling rather than by metal conduction. The graph also shows that the slope of Curve A, the mixed oxide, was highest at a voltage of 4.8 millivolts (the gap voltage). This compares very favorably with the gap voltage of a typical Josephson junction using a magnesium oxide barrier layer, Curve B, which has a gap voltage of 4.5 millivolts. The significantly higher gap voltage indicates that the Josephson junction of this invention will be able to operate at a higher superconducting transition temperature since the gap voltage is directly proportional to the transition temperature:

$$\frac{V_g}{k_B T_c} = 4.25$$

where $V_g$ equals the gap voltage, $k_B$ equals Boltzmann's constant and, and $T_c$ is the superconducting transition temperature.

What is claimed is:

1. A superconducting Josephson junction comprising:
    (A) a layer of NbN on a substrate;
    (B) a solid solution of an epitaxial layer of a pseudobinary compound on said layer of NbN, said solid solution lying between about 3 atomic % MgO and 97 atomic % CaO, and about 97 atomic % MgO and 3 atomic % CaO; and
    (C) an epitaxial layer of NbN on said layer of pseudobinary compound.

2. A junction according to claim 1 wherein said substrate is sapphire having a (11$\bar{2}$0) or a (0001) orientation.

3. A junction according to claim 1 wherein said substrate is MgO having a (100) orientation.

4. A junction according to claim 1 wherein layers (A) and (C) are each about 400 to about 5000 Angstroms thick.

5. A junction according to claim 1 wherein said layer of NbN are both single crystal layers.

6. A superconducting Josephson junction comprising:
    (A) a substrate selected from the group consisting of single crystal MgO and single crystal sapphire;
    (B) a layer of NbN about 400 to about 5000 Angstroms thick on said substrate;
    (C) a layer of epitaxial single crystal pseudobinary compound on said layer of NbN about 5 to about 25 Angstroms thick, having a composition that comprises about 78 atomic % MgO and about 22 atomic % CaO, to about 65 atomic % MgO and about 35 atomic % CaO; and
    (D) a layer of epitaxial NbN about 400 to about 5000 Angstroms thick on said layer of single crystal pseudo-binary compound.

7. A junction according to claim 6 wherein said layers of single crystal NbN are each about 1500 to about 2500 Angstroms thick.

8. A junction according to claim 6 wherein said substrate is MgO having a (100) orientation.

9. A junction according to claim 6 wherein said substrate is sapphire having a (11$\bar{2}$0) or a (0001) orientation.

10. A junction according to claim 6 wherein said layers of NbN are both single crystal layers.

11. A junction according to claim 6 wherein said layers of NbN are both polycrystalline layers.

12. A superconducting integrated circuit comprising an array of electrically connected junctions according to claim 6.

13. A superconducting processor comprising an multiplicity of electrically connected superconducting integrated circuits according to claim 12.

* * * * *